(12) United States Patent
Liu et al.

(10) Patent No.: US 10,804,250 B2
(45) Date of Patent: Oct. 13, 2020

(54) CHIP-ON-BOARD DISPLAY MODULE, MANUFACTURING METHOD THEREOF, LIGHT-EMITTING DIODE DEVICE AND MANUFACTURING METHOD THEREOF

(71) Applicant: FOSHAN NATIONSTAR OPTOELECTRONICS CO., LTD, Foshan, Guangdong (CN)

(72) Inventors: Chuanbiao Liu, Foshan (CN); Xiaofeng Liu, Foshan (CN); Feng Gu, Foshan (CN); Kuai Qin, Foshan (CN)

(73) Assignee: FOSHAN NATIONSTAR OPTOELECTRONICS CO., LTD, Foshan, Guangdong (CN)

( * ) Notice: Subject to any disclaimer, the term of this patent is extended or adjusted under 35 U.S.C. 154(b) by 0 days.

(21) Appl. No.: 16/340,150

(22) PCT Filed: Oct. 17, 2017

(86) PCT No.: PCT/CN2017/106468
§ 371 (c)(1),
(2) Date: Apr. 8, 2019

(87) PCT Pub. No.: WO2018/077058
PCT Pub. Date: May 3, 2018

(65) Prior Publication Data
US 2019/0244939 A1    Aug. 8, 2019

(30) Foreign Application Priority Data
Oct. 27, 2016 (CN) .......................... 2016 1 0955146

(51) Int. Cl.
*H01L 25/075* (2006.01)
*H01L 33/48* (2010.01)
(Continued)

(52) U.S. Cl.
CPC .......... *H01L 25/0753* (2013.01); *H01L 33/00* (2013.01); *H01L 33/005* (2013.01);
(Continued)

(58) Field of Classification Search
CPC . H01L 25/0753; H01L 27/156; H01L 33/005; H01L 33/46; H01L 33/48;
(Continued)

(56) References Cited

U.S. PATENT DOCUMENTS 8,975,101 B2 * 3/2015 Ooyabu .................. F21V 21/00
438/112
2009/0189177 A1 * 7/2009 Lee ......................... B29C 43/18
257/99

(Continued)

FOREIGN PATENT DOCUMENTS

CN    103594463 A    2/2014
CN    103680340 A    3/2014
(Continued)

OTHER PUBLICATIONS

Corresponding JP OA search report dated May 11, 2020.
Corresponding KR OA search report dated Apr. 20, 2020.

*Primary Examiner* — Stephen W Smoot
(74) *Attorney, Agent, or Firm* — Gang Yu

(57) ABSTRACT

A Chip-on-Board (COB) display module is provided, which includes a Printed Circuit Board (PCB) a plurality of Light-Emitting Diode (LED) luminous units, a packaging adhesive layer and a light shielding layer wherein the plurality of LED luminous units are mounted and fixed on the PCB, the packaging adhesive layer covers the PCB and wraps the LED luminous units thereon, a liquid passage is provided in the packaging adhesive layer between every two adjacent LED luminous units, and the light shielding layer fills the liquid passage. The COB display module further includes a reflecting layer, and the reflecting layer covers two sidewalls
(Continued)

of the liquid passage, and is positioned between the packaging adhesive layer and the light shielding layer. A manufacturing method for the COB display module is also disclosed.

23 Claims, 9 Drawing Sheets

(51) Int. Cl.
 *H01L 33/00* (2010.01)
 *H01L 33/60* (2010.01)
 *H01L 33/52* (2010.01)
 *H01L 33/46* (2010.01)

(52) U.S. Cl.
 CPC ............ *H01L 33/46* (2013.01); *H01L 33/48* (2013.01); *H01L 33/52* (2013.01); *H01L 33/60* (2013.01)

(58) Field of Classification Search
 CPC ....... H01L 33/486; H01L 33/52; H01L 33/54; H01L 33/56; H01L 33/60; H05K 1/0272; H05K 1/181
 See application file for complete search history.

(56) References Cited

U.S. PATENT DOCUMENTS

| | | | |
|---|---|---|---|
| 2010/0147661 A1* | 6/2010 | Takeda | H01H 13/83 200/314 |
| 2011/0261550 A1 | 10/2011 | Wong et al. | |
| 2012/0235193 A1 | 9/2012 | Hu et al. | |
| 2015/0372185 A1* | 12/2015 | Rossi | H01L 31/1876 438/27 |
| 2016/0020371 A1* | 1/2016 | Kang | H01L 33/60 257/91 |
| 2017/0133357 A1* | 5/2017 | Kuo | H01L 25/167 |
| 2018/0309034 A1* | 10/2018 | Ooyabu | H01L 33/50 |
| 2019/0319176 A1* | 10/2019 | Sato | H01L 33/505 |

FOREIGN PATENT DOCUMENTS

| | | |
|---|---|---|
| CN | 203588605 U | 5/2014 |
| CN | 204632804 U | 9/2015 |
| CN | 205038923 U | 2/2016 |
| CN | 206210838 U | 5/2017 |
| JP | 2001118865 A | 4/2001 |
| JP | 2004087973 A | 3/2004 |
| JP | 2010232644 A | 10/2010 |
| JP | 2012059939 A | 3/2012 |
| JP | 2013062416 A | 4/2013 |
| JP | 2013-153070 A | 8/2013 |
| JP | 2014236175 A | 12/2014 |
| JP | 2015084374 A | 4/2015 |

* cited by examiner

CHIP-ON-BOARD DISPLAY MODULE, MANUFACTURING METHOD THEREOF, LIGHT-EMITTING DIODE DEVICE AND MANUFACTURING METHOD THEREOF

RELATED APPLICATIONS

The present application is a national phase entry under 35 U.S.C. § 371 of International Patent Application No. PCT/CN2017/106468, filed Oct. 17, 2017, entitled "Chip-on-Board (COB) display module, manufacturing method thereof, Light-Emitting Diode (LED) device and manufacturing method thereof", which claims priority to Chinese Patent Application No. 201610955146.0, filed on Oct. 27, 2016 and entitled both of which are incorporated herein by reference in their entirety.

TECHNICAL FIELD

The disclosure belongs to a field of manufacturing of photoelectric device, and particularly to a COB display module and a manufacturing method thereof, as well as a LED device and a manufacturing method thereof.

BACKGROUND

A COB technology, also called a "Chip-on-Board technology", refers to a process of placing an LED chip on a circuit board, then leading bonding packaging and protecting the LED chip and a wire by use of a packaging adhesive. Compared with a Surface Mounted Device (SMD) technology integrating discrete LED devices, the COB technology may effectively shorten a pixel pitch of a display module or a display screen and improve a resolution ratio and also has advantages of simplifying a manufacturing procedure, reducing packaging and welding production cost, improving heat radiation performance and the like. However, the COB technology is confronted with such a problem that LED chips of adjacent luminous units may interfere each other during light emission to cause light mixing phenomena and reduce display contrast. For solving this problem, a latticed black mask is usually adhered to the circuit board in a related art, and the black mask is adopted to isolate the adjacent luminous units.

The black mask may reduce the light mixing phenomena and improve the display contrast of the COB display module, but may also absorb part of light emitted by the LED chips to bring a light, loss and decrease a light output effect.

SUMMARY

For solving the shortcoming of the related art, some embodiments of the disclosure provide a COB display module which is high in display contrast and low in light loss and has a good light condensation effect.

The disclosure is implemented through a following technical solution.

A Chip-on-Board (COB) display module includes a Printed Circuit Board (PCB), a plurality of Light-Emitting Diode (LED) luminous units, a packaging adhesive layer and a light shielding layer, wherein the plurality of LED luminous units are mounted and fixed on the PCB, the packaging adhesive layer covers the PCB and wraps the LED luminous units thereon, a liquid passage is provided in the packaging adhesive layer between every two adjacent LED luminous units, and the light shielding layer fills the liquid passage; and the COB display module further includes a reflecting layer, and the reflecting layer covers two sidewalls of the liquid passage, and is positioned between the packaging adhesive layer and the light shielding layer.

Compared with the related art, not only is the light shielding layer provided in the COB display module provided in the disclosure, but also the reflecting layer is provided. The light shielding layer forms cup-shaped structures to surround a periphery of each of the plurality of LED luminous units, so that light mixing phenomena of light emitted by every two adjacent LED luminous units may be effectively reduced, and the display contrast and resolution are improved. By the reflecting layer, the light condensation effect may be achieved, the light emitted by the LED luminous units may be prevented from being absorbed by the light shielding layer, light loss may be reduced, and illumination brightness and light output effect may be improved. Therefore, the COB display module has advantages of the high display contrast, high resolution, low light loss and the good light condensation effect.

In an exemplary embodiment, the light shielding layer covers the two sidewalls and a bottom of the liquid passage, a gap is formed between the light shielding layer covering the two sidewalls of the liquid passage, or the light shielding layer completely fills the liquid passage.

In an exemplary embodiment, the light shielding layer fills a part of the liquid passage, and a surface of the light shielding layer is lower than an illuminant surface of the packaging adhesive layer.

In an exemplary embodiment, a thickness of the reflecting layer covering each sidewall of the liquid passage is less than 0.1 mm.

In an exemplary embodiment, the reflecting layer covers the bottom of the liquid passage.

In an exemplary embodiment, the light shielding layer is black PPA plastics or black PCT plastics or black EMC plastics.

In an exemplary embodiment, the reflecting layer is at least one of an aluminum or tin or silver doped epoxy resin, an aluminum or tin or silver doped silicon resin, an aluminum or tin or silver doped acrylic resin and an aluminum or tin or silver doped polycarbonate.

In an exemplary embodiment, a depth of the liquid passage is less than a thickness sum of the packaging adhesive layer and the PCB.

In an exemplary embodiment, a depth of the liquid passage is less than a thickness of the packaging adhesive layer.

In an exemplary embodiment, a thickness of the packaging adhesive layer is 0.5 mm-1.6 mm, and a depth of the liquid passage is 0.3 mm-1.5 mm.

In an exemplary embodiment, a thickness of the packaging adhesive layer is 0.15-1.6 mm, and a depth of the liquid passage is 0.08 mm-1.5 mm.

In an exemplary embodiment, the PCB is a single-layer circuit board or a multilayer circuit board.

In an exemplary embodiment, the plurality of LED luminous units are provided in a linear array or a triangular array, each of the plurality of LED luminous units includes a red LED chip, a green LED chip and a blue LED chip, and each of the red LED chip, the green LED chip and the blue LED chip is any one of a horizontal chip or a flip chip.

In an exemplary embodiment, the COB display module further includes at least one driver Integrated Chip (IC), at least one resistor and at least one capacitor, and the driver IC, the resistor and the capacitor are mounted on a back surface of the PCB.

Some embodiments of the disclosure provide a manufacturing method for a COB display module, which includes the following steps:

S1: the plurality of LED luminous units are mounted and fixed on a PCB;

S2: a packaging adhesive covers the PCB and wraps the plurality of LED luminous units thereon to form a packaging adhesive layer, and a liquid passage is formed in the packaging adhesive layer between every two adjacent LED luminous units;

S3: a reflecting material covers two sidewalls of the liquid passage to form a reflecting layer;

S4: a mask is prepared, the mask being provided with a plurality of mounting holes matched with a number of the plurality of LED luminous units, then the mask is mounted on the PCB, and each of the plurality of LED luminous units is arranged in each of the plurality of mounting holes to make the mask become a light shielding layer filling the liquid passage; or, a light shielding material is injected into the liquid passage to form the light shielding layer filling the liquid passage.

In an exemplary embodiment, S4 is implemented as follows: the light shielding material is injected into the liquid passage to form the light shielding layer covering the two sidewalls and bottom of the liquid passage, the reflecting layer being positioned between the packaging adhesive layer and the light shielding layer.

In an exemplary embodiment, in S3, the reflecting material is injected into the liquid passage by use of an injection mold to form the reflecting layer covering the two sidewalls of the liquid passage or form the reflecting layer covering the two sidewalls and the bottom of the liquid passage.

In an exemplary embodiment, in S3, a protective film cover illuminant surfaces of the packaging adhesive layer, then the two sidewalls of the liquid passage or the two sidewalls and the bottom of the liquid passage are spray-coated with the reflecting material, and the protective film is removed after spray-coating.

In an exemplary embodiment, in S1, the plurality of LED luminous units are arranged according to a matrix and are fixedly mounted on the PCB respectively; and in S3, there are a plurality of protective films, the plurality of protective films transversely cover the illuminant surfaces of the packaging adhesive layer on the LED luminous units of each row respectively, then the liquid passage between the LED luminous units of every two adjacent rows is spray-coated with the reflecting material, the protective films are removed, the plurality of protective films longitudinally cover the illuminant surfaces of the packaging adhesive layer on the LED luminous units of each column respectively, then the liquid passage between the LED luminous units of every two adjacent columns is spray-coated with the reflecting material, and the plurality of protective films are finally removed.

In an exemplary embodiment, in S4, the light shielding material is injected into the liquid passage by use of an injection mold to completely fill the liquid passage with the formed light shielding layer or form a gap between light shielding layers covering the two sidewalls of liquid passage.

In an exemplary embodiment, in S2, the packaging adhesive layer is cut to form the liquid passage, and a cutting depth of the liquid passage is less than a thickness sum of the packaging adhesive layer and the PCB; or, the packaging adhesive covers the PCB by use of an injection mold to form the packaging adhesive layer with the liquid passage, a depth of the liquid passage being less than or equal to a thickness of the packaging adhesive layer.

The manufacturing method for the COB display module in the disclosure is easy to implement and operate and the steps are simple and reasonable.

Some embodiments of the disclosure provide a manufacturing method for an LED device, which includes the following steps: a COB display module is manufactured at first according to any abovementioned manufacturing method for the COB display module, and then through cutting is performed by use of a cutter along a liquid passage of the manufactured COB display module to obtain a single LED device, a width of the cutter being less than a width of the liquid passage and a cutting position thereof being provided in a middle of the liquid passage.

Some embodiments of the disclosure provide an LED device, which is manufactured by the abovementioned manufacturing method for the LED device.

For better understanding and implementation, the disclosure will be described below in combination with drawings in detail.

DETAILED DESCRIPTION OF THE EMBODIMENTS

Embodiment 1

Figure 1:
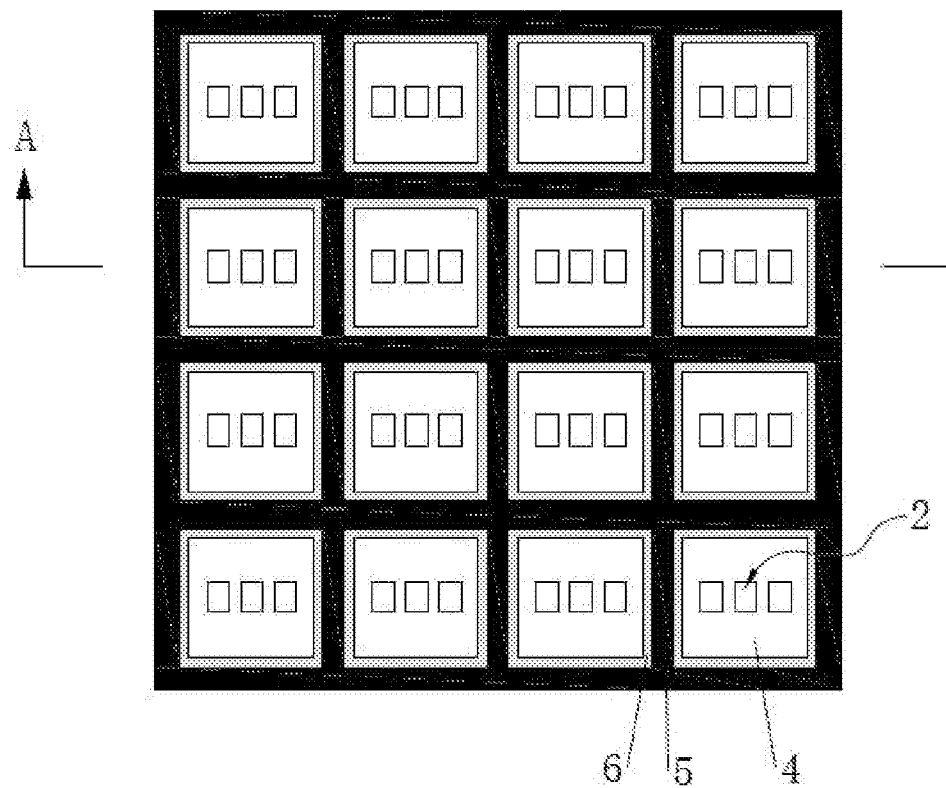
FIG. 1 is a top view of a COB display module according to an embodiment of the disclosure.
Figure 2:
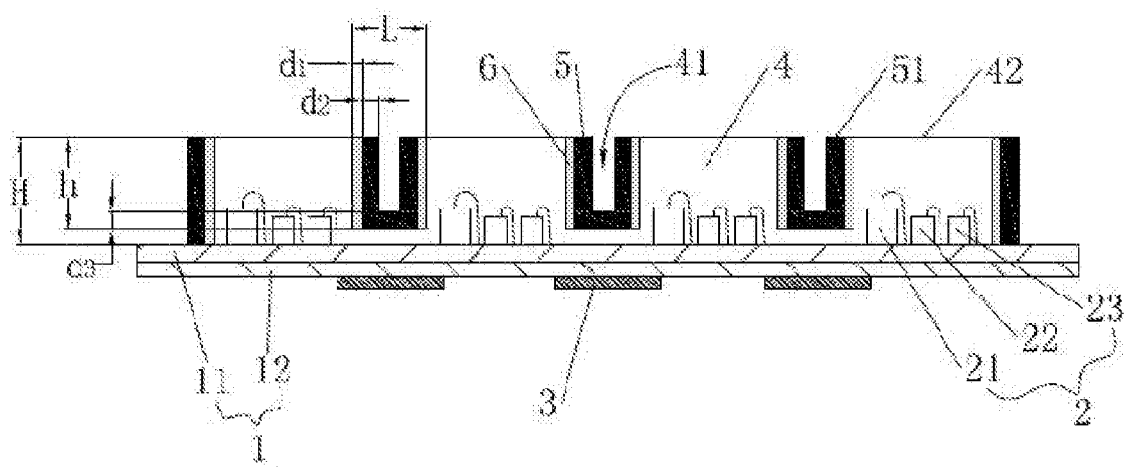
FIG. 2 is a sectional view in an A-A direction according to a first implementation mode of FIG. 1.

Referring to both of FIG. 1 and FIG. 2, FIG. 1 is a top view of a COB display module according to an embodiment of the disclosure and FIG. 2 is a sectional view in an A-A direction according to a first implementation mode of FIG. 1. The embodiment of the disclosure provides a COB display module. The COB display module includes a PCB (Printed Circuit Board) 1, a plurality of LED luminous units 2, a plurality of driver ICs 3, a packaging adhesive layer 4, a light shielding layer 5 and a reflecting layer 6.

The plurality of LED luminous units 2 are mounted and fixed on a front surface of the PCB 1, the plurality of driver ICs 3 are mounted and fixed on a back surface of the PCB 1, and the plurality of LED luminous units 2 are electrically connected with the plurality of driver IC3 one to one. The packaging adhesive layer 4 covers a front surface of the PCB 1 and wraps the plurality of LED luminous units 2 provided on the front surface of the PCB 1. A groove-shaped liquid passage 41 is provided in the packaging adhesive layer 4 between every two adjacent LED luminous units 2. The light shielding layer 5 covers two sidewalls and a bottom of the liquid passage 41. The reflecting layer 6 covers the two sidewalls of the liquid passage 41, and is positioned between the packaging adhesive layer 4 and the light shielding layer 5.

The PCB 1 includes an upper-layer circuit board 11 and a lower-layer circuit board 12 which are provided in a lamination manner, and each of the upper-layer circuit board 11 and the lower-layer circuit board 12 may be a single-layer circuit board or a multilayer circuit board.

The plurality of LED luminous units 2 are uniformly distributed on the upper-layer circuit board 11 of the PCB 1, are specifically arranged in a matrix, or in a regular triangle and the like, and are preferably arranged in a matrix. Each of the plurality of LED luminous units 2 is a group of RGB LED chips, including a red LED chip 21, a green LED chip 22 and a blue LED chip 23, and the red LED chip 21, the green LED chip 22 and the blue LED chip 23 are electrically connected with the PCB 1 through wires respectively.

The plurality of driver ICs 3 are mounted and fixed at a bottom of the lower-layer circuit board 12 of the PCB 1 respectively. Each driver 103 refers to a common LED driver chip.

The packaging adhesive layer 4 covers the front surface of the PCB 1 in a laying manner, and its thickness H is 0.5 mm-1.6 mm. A depth h of the liquid passage 41 is 0.3 mm-1.5 mm and less than the thickness H of the packaging adhesive layer 4. A surface of the packaging adhesive layer 4 covering each of the plurality of LED luminous units 2 is an illuminant surface 42. The packaging adhesive layer 4 is a material such as an epoxy resin or a silicon resin.

The reflecting layer 6 completely covers the two sidewalls of the liquid passage 41, and a thickness d1 of the reflecting layer 6 covering each sidewall of the liquid passage 41 is less than 0.1 mm. The reflecting layer 6 is a reflecting material, in an exemplary embodiment, the reflecting layer 6 is a material with a reflecting effect such as an aluminum or tin or silver doped epoxy resin, an aluminum or tin or silver doped silicon resin, an aluminum or tin or silver doped acrylic resin or an aluminum or tin or silver doped polycarbonate, has a mirror effect, and may implement light condensation, avoid light emitted by the LED luminous units 2 being absorbed by the light shielding layer 5, reduce light loss and improve illumination brightness and a light output effect.

The light shielding layer 5 completely covers the two sidewalls and the bottom of the liquid passage 41. The light shielding layer 5 is a light shielding material, may specifically be a dark light shielding material, and is preferably a black material, specifically black Polyphthalamide (PPA) plastics or black Procalcitonin (PCT) plastics. The light shielding layer 5 forms cup-shaped structures to surround a periphery of each of the plurality of LED luminous units 2, so that light mixing phenomena of light emitted by every two adjacent LED luminous units may be effectively reduced, and display contrast and resolution are improved. The light shielding layer 5 is combined with the two sidewalls and the bottom of the liquid passage 41 with a high combination power. Compared with a related method of adhering a black mask, the light shielding layer 5 is more unlikely to be detached.

Figure 3:
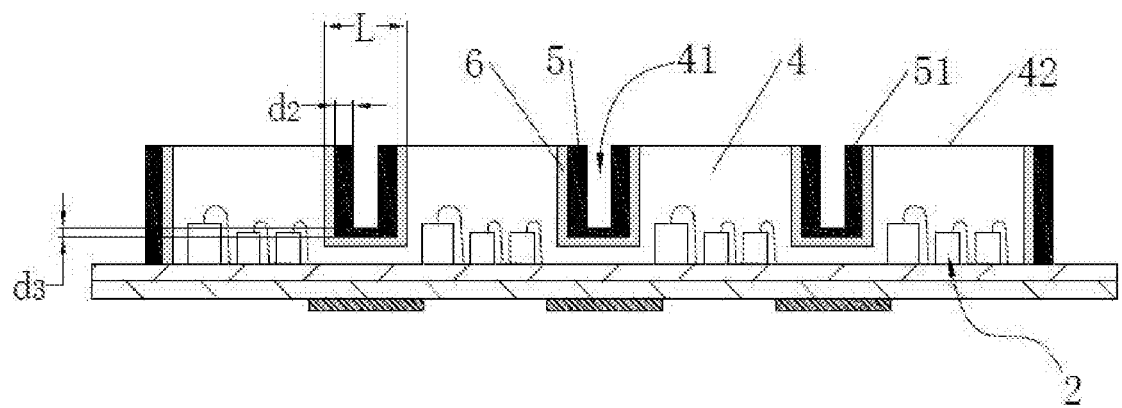
FIG. 3 is a sectional view in an A-A direction according to a second implementation mode of FIG. 1.

As shown in FIG. 2 and FIG. 3, when a width L of the liquid passage 41 between every two adjacent LED luminous units 2 is more than 1.2 mm, a gap is formed between the light shielding layers 5 covering the two sidewalls of the liquid passage 41. A thickness d2 of the light shielding layer 5 covering each sidewall of the liquid passage 41 is 0.3 mm-0.5 mm, and its top surface 51 is flush with the illuminant surface 42 of the packaging adhesive layer 4. A thickness d3 of the light shielding layer 5 covering the bottom of the liquid passage 41 is 0.1 mm-0.2 mm. Such an arrangement is made to reduce a using amount of a material for the light shielding layer 5 and reduce a cost, and is applied to the COB display module with a relatively long distance between the two adjacent LED luminous units 2 and a relatively low resolution ratio requirement. According to different manufacturing processes and practical requirements, the reflecting layer 6 may cover the bottom of the liquid passage 41, and may also not cover the bottom of the liquid passage 41.

Figure 4:
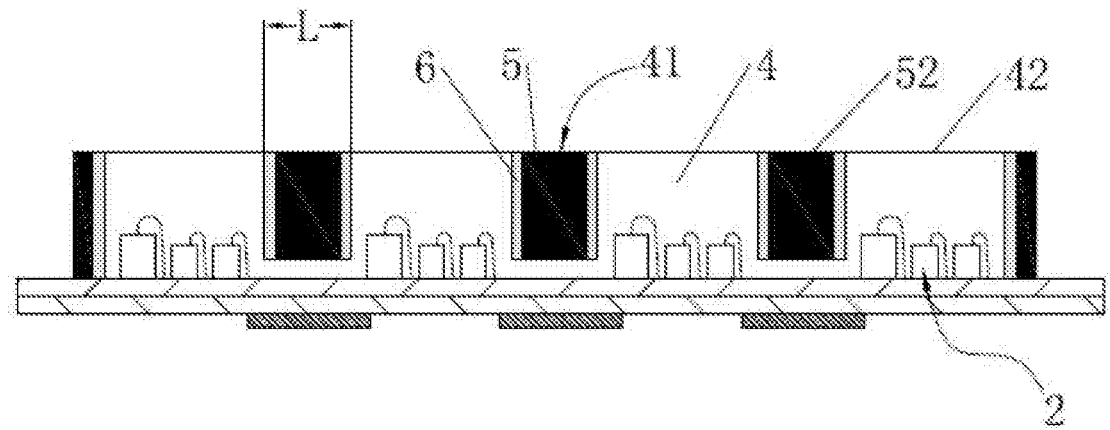
FIG. 4 is a sectional view in an A-A direction according to a third implementation mode of FIG. 1.
Figure 5:
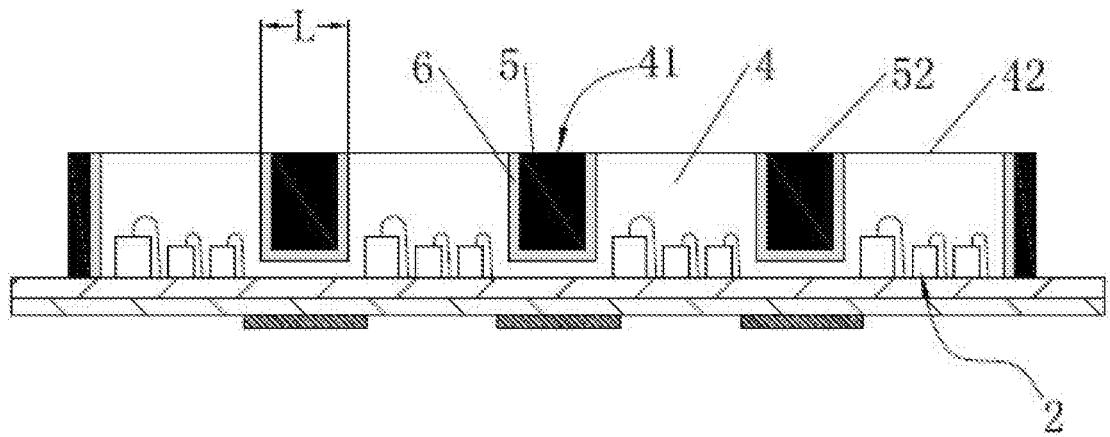
FIG. 5 is a sectional view in an A-A direction according to a fourth implementation mode of FIG. 1.

As shown in FIG. 4 and FIG. 5, when the width L of the liquid passage 41 between every two adjacent LED luminous units 2 is less than or equal to 1.2 mm, the light shielding layer 5 completely fills the liquid passage 41 and its surface 52 is flush with the illuminant surface 42 of the packaging adhesive layer 4. Such an arrangement is made to simplify a manufacturing procedure and improve production efficiency, and is applied to the COB display module with a relatively short distance between the two adjacent LED luminous units 2 and a relatively high resolution ratio requirement. According to different manufacturing processes and practical requirements, the reflecting layer 6 may cover the bottom of the liquid passage 41, and may also not cover the bottom of the liquid passage 41.

Figure 6:
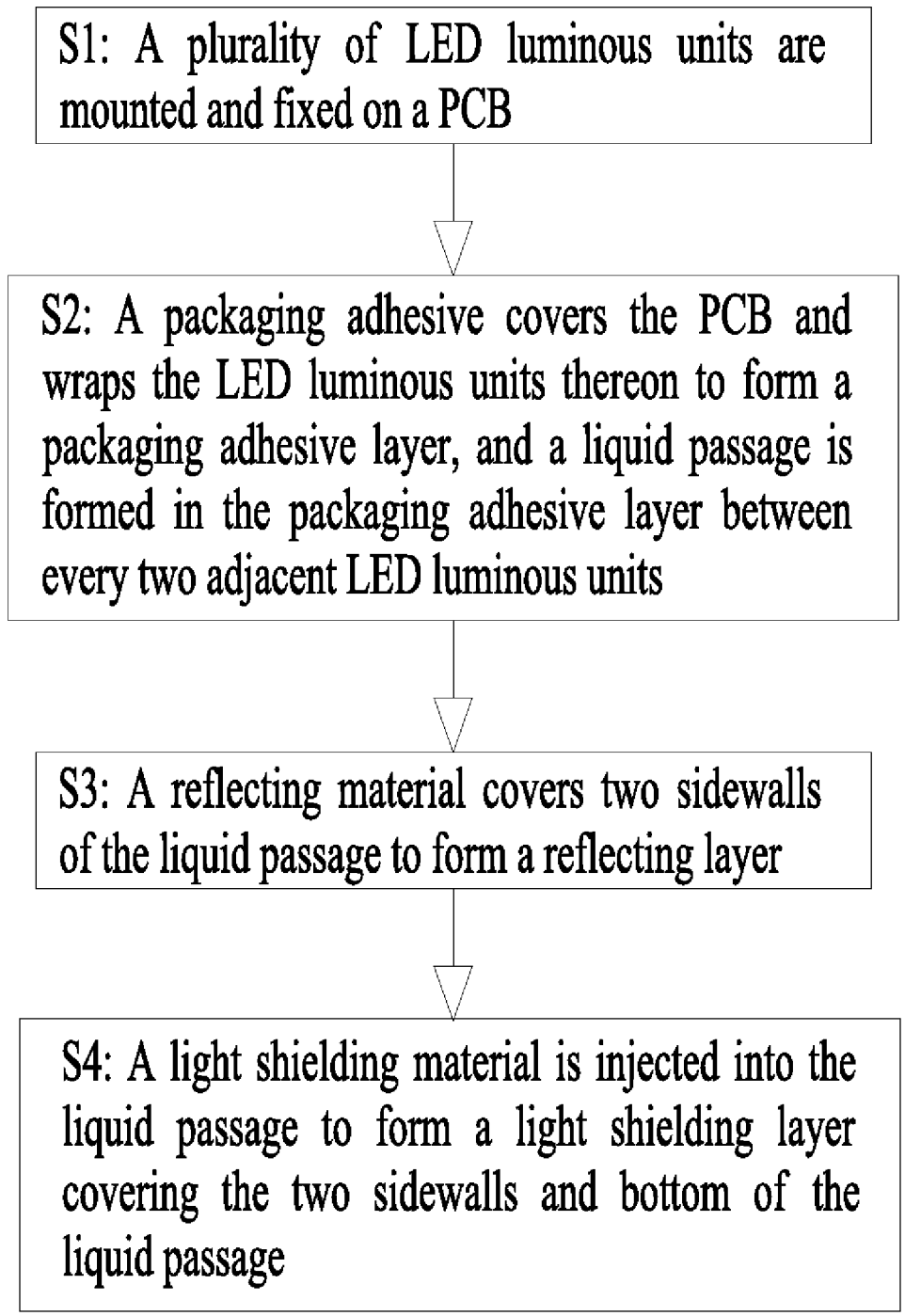
FIG. 6 is a flowchart of a manufacturing method for a COB display module according to an embodiment of the disclosure.
Figure 7:
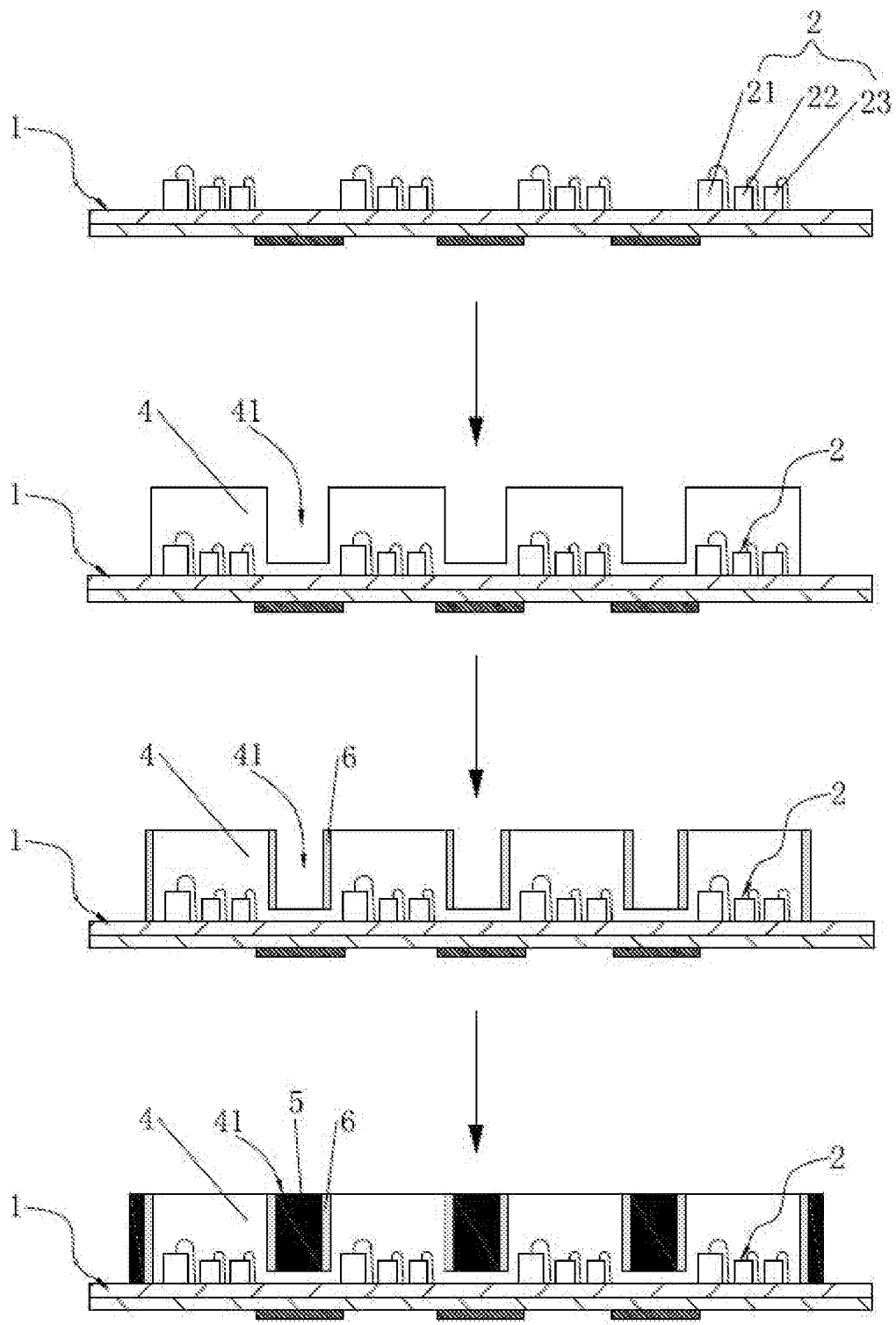
FIG. 7 is a flowchart of FIG. 6.

Referring to both of FIG. 6 and FIG. 7, FIG. 6 is a flowchart of a manufacturing method for the COB display module according to an embodiment of the disclosure and FIG. 7 is a flowchart of FIG. 6. On the basis of the abovementioned COB display module, an embodiment of the disclosure also provides the manufacturing method for the COB display module. The manufacturing method includes the following steps.

S1, a plurality of LED luminous units 2 are mounted and fixed on a PCB 1.

S2, a packaging adhesive covers the PCB 1 and wraps the plurality of LED luminous units 2 thereon to form a packaging adhesive layer 4, and a liquid passage 41 is formed in the packaging adhesive layer 4 between every two adjacent LED luminous units 2.

S3, a reflecting material covers two sidewalls of the liquid passage 41 to form a reflecting layer 6.

S4, a light shielding material is injected into the liquid passage 41 to form a light shielding layer 5 covering the two sidewalls and the bottom of the liquid passage 41, the reflecting layer 6 being positioned between the packaging adhesive layer 4 and the light shielding layer 5.

Specifically, in S1, the plurality of LED luminous units 2 are arranged according to a matrix, and are fixedly mounted on the PCB 1 respectively, and then a red LED chip 21, a green LED chip 22 and a blue LED chip 23 in each of the plurality of LED luminous units 2 are electrically connected with the PCB 1 by leading bonding respectively.

In S2, the packaging adhesive covers the PCB 1 in a laying manner by use of an injection mold, and wraps the plurality of LED luminous units 2 thereon. The liquid passage 41 may be formed in the packaging adhesive layer 4 between every two adjacent LED luminous units 2 by use of the injection mold, and the liquid passage 41 may also be provided by methods of cutting, dicing and the like.

In S3, the reflecting material is injected into the liquid passage 41 by use of the injection mold to form the reflecting layer 6 covering the two sidewalls of the liquid passage 41 or form the reflecting layer 6 covering the two sidewalls and the bottom of the liquid passage 41 according to a specific shape and using a method of the injection mold.

In S4, the light shielding material is injected into the liquid passage 41 by use of the injection mold to form the light shielding layer 5, and the light shielding layer 5 completely fill the liquid passage 41 or form the gap between the light shielding layers 5 covering the two sidewalls of the liquid passage 41.

Those skilled in the art may select or manufacture the corresponding injection mold in the steps without creative work according to a practical requirement such as the width of the liquid passage 41, a dimension parameter of the reflecting layer 6 or a dimension parameter of the light shielding layer 5.

Embodiment 2

The embodiment is substantially the same as the contents of embodiment 1. The difference is that: in S3, a protective film covers the illuminant surface 42 of the packaging adhesive layer 4, then the two sidewalls of the liquid passage 41 or the two sidewalls and the bottom of the liquid passage 41 are spray-coated with the reflecting material, and the protective film is removed after spray-coating.

Figure 8:
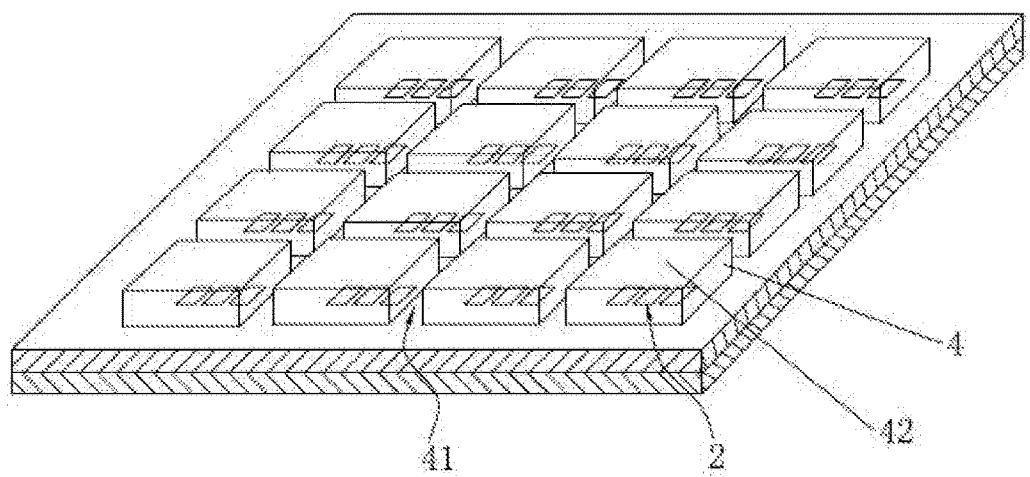
FIG. 8 is a structure diagram of a semi-finished product, obtained in S2, of a COB display module.

Referring to FIG. 8, a structure diagram of a semi-finished product, obtained in S2, of the COB display module is illustrated. The packaging adhesive layer 4 covers the plurality of LED luminous units 2. Since the liquid passage 41 is provided in the packaging adhesive layer 4 between every two adjacent LED luminous units 2, the packaging adhesive layer 4 forms a plurality of cubes arranged in a matrix, and a top surface of each of the plurality of cubes is the illuminant surface 42 of the packaging adhesive layer 4.

Figure 9:
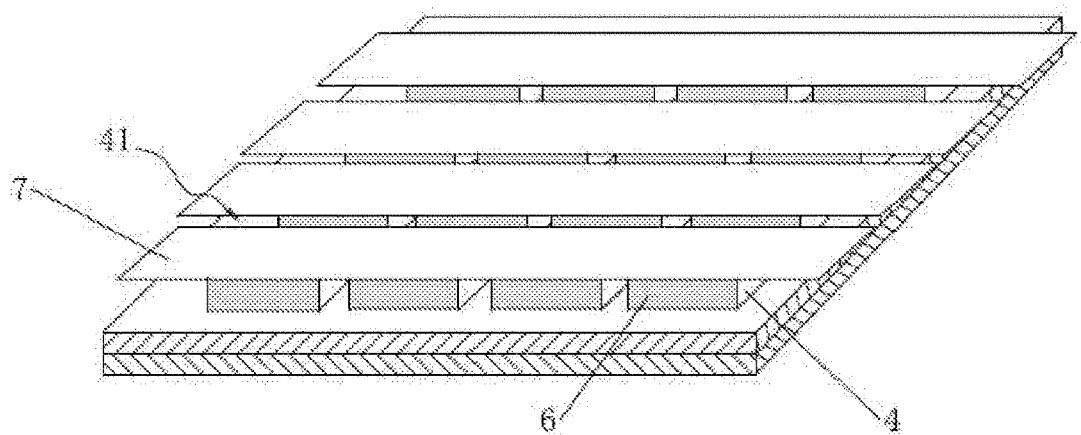
FIG. 9 is a schematic diagram of transversely covering a packaging adhesive layer with a plurality of strip-type protective films.

In S3, as shown in FIG. 9, a plurality of strip-type protective films 7 transversely cover the illuminant surface 42 of the packaging adhesive layer 4 on the plurality of LED luminous units 2 of each row respectively, then the liquid passage 41 between the plurality of LED luminous units 2 of every two adjacent rows is spray-coated with the reflecting material, the plurality of protective films 7 are removed, and then one pair of mutually parallel lateral surfaces of each cube cover the reflecting layer 6.

Figure 10:
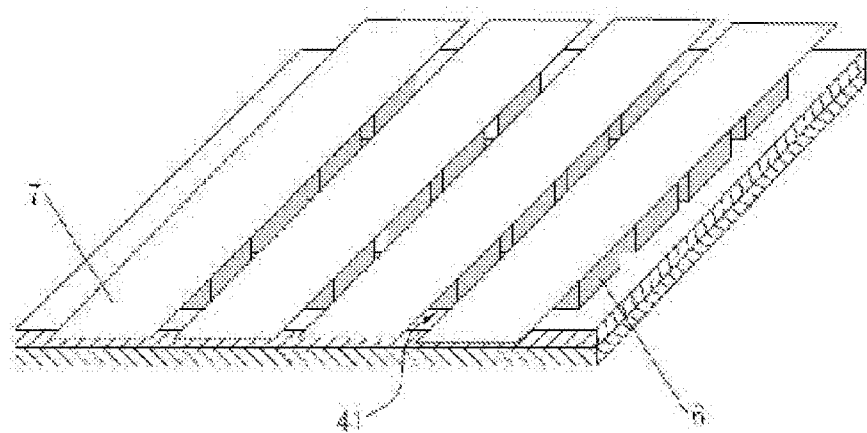
FIG. 10 is a schematic diagram of longitudinally covering a packaging adhesive layer with a plurality of strip-type protective films.

Then, as shown in FIG. 10, the plurality of strip-type protective films 7 longitudinally cover the illuminant surface 42 of the packaging adhesive layer 4 on the plurality of LED luminous units 2 of each column respectively, then the liquid passage 41 between the plurality of LED luminous units 2 of every two adjacent columns is spray-coated with the reflecting material, and then another pair of mutually parallel lateral surfaces of each cube cover the reflecting layer 6. Finally, the plurality of strip-type protective films 7 are removed to obtain the semi-finished product of the COB display module completely covering the reflecting layer 6, and then S4 may be executed.

Or, the plurality of strip-type protective films 7 may also longitudinally cover the illuminant surface 42 at first, then the reflecting material is spray-coated, the plurality of protective films 7, after being removed, may transversely cover the illuminant surface, and then the reflecting material is spray-coated. "Transverse", "longitudinal", "row" and "column" are only adopted for convenient description and not intended to limit a practical operating sequence of S3.

Each of the protective films 7 is an ordinary sticker and may be adhered to the packaging adhesive layer 4. End portions of the plurality of strip-type protective films 7 may be connected, so that all of the protective films 7 may be adhered or torn at one time.

By the protective films 7, the reflecting material may be prevented from polluting the illuminant surface 42 of the packaging adhesive layer 4. The reflecting layer 6 covers the two sidewalls of the liquid passage 41 in a manner of spray-coating the reflecting material, which, compared with injection of the reflecting material, may avoid use or customization of a corresponding injection mold, so that manufacturing cost is reduced, and convenience and rapidness are achieved.

Compared with the related art, not only the light shielding layer is provided in the COB display module of the disclosure, but also the reflecting layer is provided, so that the advantages of high display contrast, high resolution and low light loss are achieved. In addition, the manufacturing method for the COB display module is simple, reasonable and easy to implement.

Embodiment 3

Figure 11:
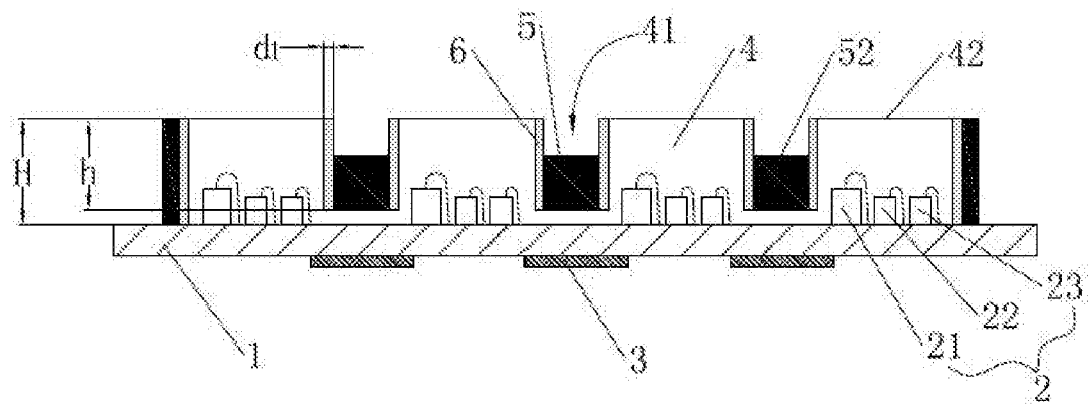
FIG. 11 is a sectional view in an A-A direction according to a fifth implementation mode of FIG. 1.

Referring to both of FIG. 1 and FIG. 11, FIG. 1 is a top view of a COB display module according to an embodiment of the disclosure and FIG. 11 is a sectional view in an A-A direction according to a fifth implementation mode of FIG. 1. An embodiment of the disclosure provides a COB display module. The COB display module includes a PCB 1, a plurality of LED luminous units 2, at least one driver IC 3, at least one resistor, at least one capacitor, a packaging adhesive layer 4, a light shielding layer 5 and a reflecting layer 6.

The plurality of LED luminous units 2 are mounted and fixed on a front surface of the PCB 1, and the driver IC 3, the resistor and the capacitor are mounted and fixed on a back surface of the PCB 1. The packaging adhesive layer 4 covers the front surface of the PCB 1 and wraps the plurality of LED luminous units 2 thereon. A groove-shaped liquid passage 41 is provided in the packaging adhesive layer 4 between every two adjacent LED luminous units 2. The light shielding layer 5 fills the liquid passage 41. The reflecting layer 6 covers two sidewalls of the liquid passage 41, and is positioned between the packaging adhesive layer 4 and the light shielding layer 5.

The PCB 1 is a single-layer circuit board or a multilayer circuit board.

The plurality of LED luminous units 2 are uniformly distributed on the PCB 1, and are specifically arranged in a linear array or a triangular array. Each of the plurality of LED luminous units 2 is a group of RGB LED chips, including a red LED chip 21, a green LED chip 22 and a blue LED chip 23, and each of the red LED chip 21, the green LED chip 22 and the blue LED chip 23 is any one of a horizontal chip or a flip chip, and is electrically connected with the PCB 1 through a wire.

The packaging adhesive layer 4 covers the front surface of the PCB 1 in a laying manner, and its thickness H is 0.15 mm-1.6 mm. A depth h of the liquid passage 41 is 0.08 mm-1.5 mm. The depth h of the liquid passage 41 is less than a thickness sum of the packaging adhesive layer 4 and the PCB 1.

A surface of the packaging adhesive layer 4 covering each of the plurality of LED luminous units 2 is its illuminant surface 42. The packaging adhesive layer 4 is a material such as an epoxy resin or a silicon resin.

The reflecting layer 6 completely covers the two sidewalls of the liquid passage 41, and a thickness d1 of the reflecting layer 6 covering each sidewall of the liquid passage 41 is less than 0.1 mm. The reflecting layer 6 is a reflecting material, is specifically a material with a reflecting effect such as an aluminum or tin or silver doped epoxy resin, an aluminum or tin or silver doped silicon resin, an aluminum or tin or silver doped acrylic resin or an aluminum or tin or silver doped polycarbonate, has a mirror effect, and may implement light condensation, avoid light emitted by the LED plurality of luminous units 2 being absorbed by the light shielding layer 5, reduce light loss and improve illumination brightness and a light output effect.

The light shielding layer 5 is a light shielding material, may specifically be a dark light shielding material, and is preferably a black material, specifically black PPA plastics or black PCT plastics or black EMC plastics. The light shielding layer 5 forms cup-shaped structures to surround a periphery of each of the plurality of LED luminous units 2, so that light mixing phenomena of light emitted by every two adjacent LED luminous units 2 may be effectively reduced, and display contrast and resolution are improved.

There are a plurality of implementation modes for the COB display module of the disclosure.

As shown in FIG. 11, the depth h of the liquid passage 41 is less than a thickness H of the packaging adhesive layer 4. The light shielding layer 5 fills a part of the liquid passage 41, and a surface 52 thereof is lower than an illuminant surface 42 of the packaging adhesive layer 4.

Figure 12:
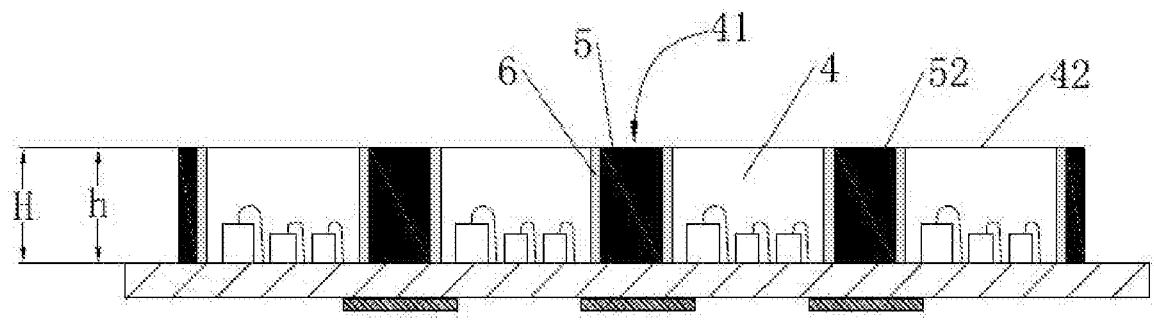
FIG. 12 is a sectional view in an A-A direction according to a sixth implementation mode of FIG. 1.

As shown in FIG. 12, the depth h of the liquid passage 41 is equal to the thickness H of the packaging adhesive layer 4. The light shielding layer 5 completely fills the liquid passage 41, and the surface 52 thereof is flush with the illuminant surface 42 of the packaging adhesive layer 4.

Figure 13:
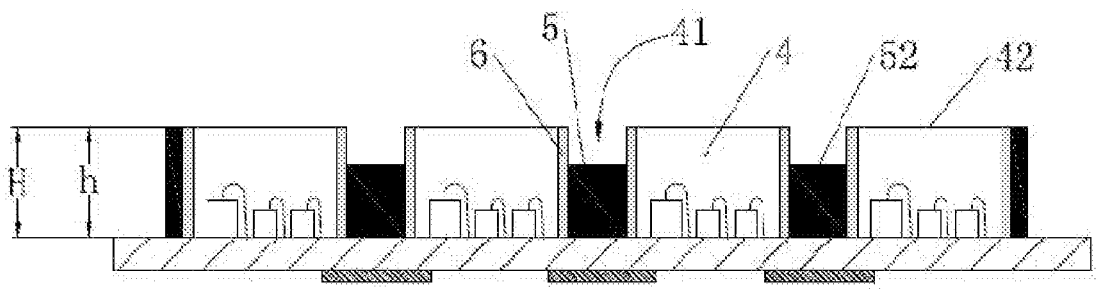
FIG. 13 is a sectional view in an A-A direction according to a seventh implementation mode of FIG. 1.

As shown in FIG. 13, the depth h of the liquid passage 41 is equal to the thickness H of the packaging adhesive layer 4. The light shielding layer 5 fills a part of the liquid passage 41, and the surface 52 thereof is lower than the illuminant surface 42 of the packaging adhesive layer 4.

Figure 14:
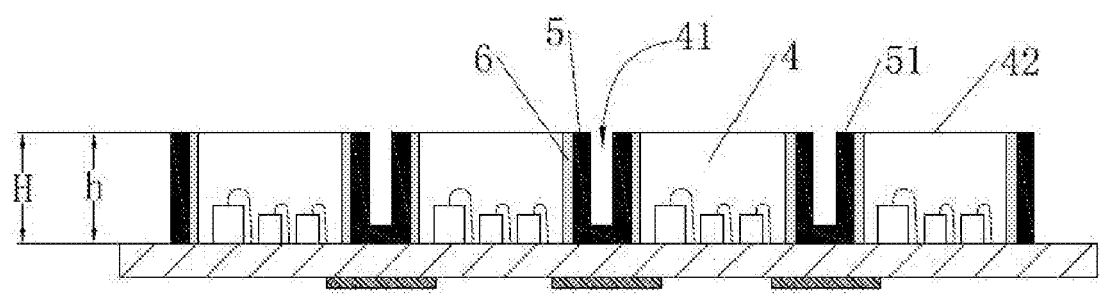
FIG. 14 is a sectional view in an A-A direction according to an eighth implementation mode of FIG. 1.

As shown in FIG. 14, the depth h of the liquid passage 41 is equal to the thickness H of the packaging adhesive layer 4. The light shielding layer 5 covers the two sidewalls and the bottom of the liquid passage 41, and a gap is formed between the light shielding layers 5 covering the two sidewalls of the liquid passage 41. A top surface 51 of the light shielding layer 5 is flush with the illuminant surface 42 of the packaging adhesive layer 4.

Figure 15:
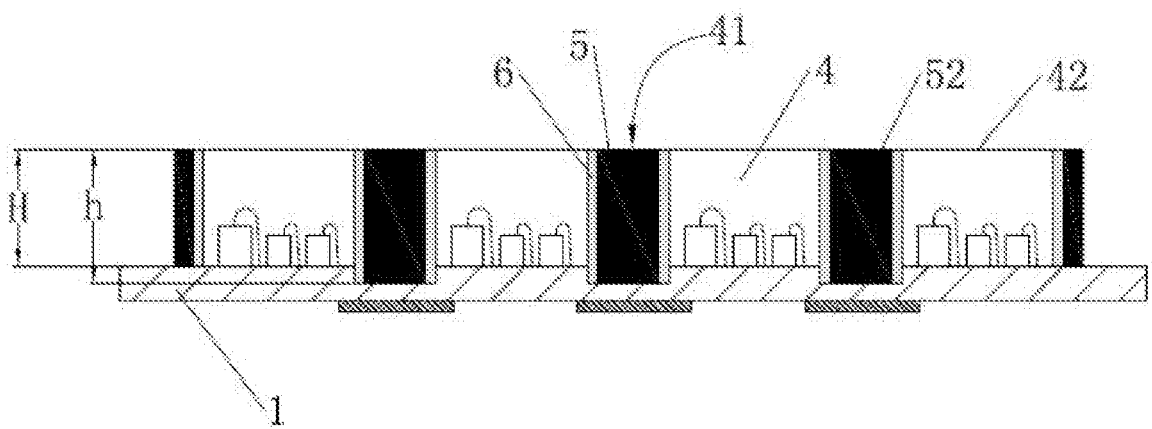
FIG. 15 is a sectional view in an A-A direction according to a ninth implementation mode of FIG. 1.

As shown in FIG. 15, the depth h of the liquid passage 41 is more than the thickness H of the packaging adhesive layer 4 and less than a thickness sum of the packaging adhesive layer 4 and the PCB 1. The light shielding layer 5 completely fills the liquid passage 41, and the surface 52 thereof is flush with the illuminant surface 42 of the packaging adhesive layer 4.

Figure 16:
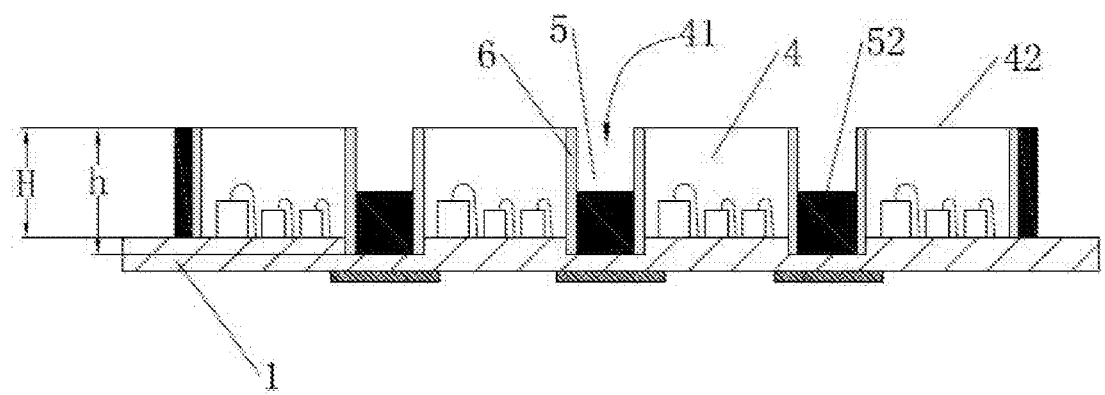
FIG. 16 is a sectional view in an A-A direction according to a tenth implementation mode of FIG. 1.

As shown in FIG. 16, the depth h of the liquid passage 41 is more than the thickness H of the packaging adhesive layer 4 and less than the thickness sum of the packaging adhesive layer 4 and the PCB 1. The light shielding layer 5 fills a part of the liquid passage 41, and the surface 52 thereof is lower than the illuminant surface 42 of the packaging adhesive layer 4.

Figure 17:
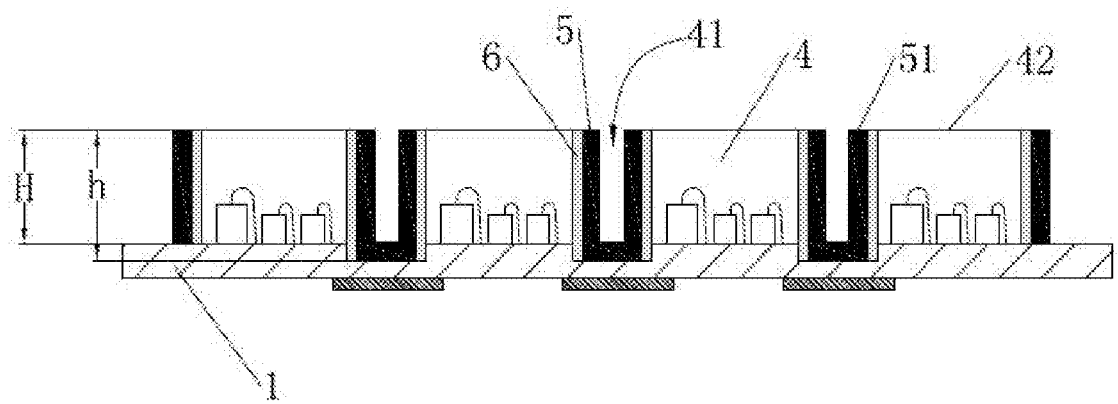
FIG. 17 is a sectional view in an A-A direction according to an eleventh implementation mode of FIG. 1.

As shown in FIG. 17, the depth h of the liquid passage 41 is more than the thickness H of the packaging adhesive layer 4 and less than the thickness sum of the packaging adhesive layer 4 and the PCB 1. The light shielding layer 5 covers the two sidewalls and bottom of the liquid passage 41, and the gap is formed between the light shielding layers 5 covering the two sidewalls of the liquid passage 41. The top surface 51 of the light shielding layer 5 is flush with the illuminant surface 42 of the packaging adhesive layer 4.

The reflecting layer 6 shown in FIG. 11-17 does not cover the bottom of the liquid passage 41, and according to different manufacturing processes and practical requirements, the reflecting layer 6 may also cover the bottom of the liquid passage 41.

On the basis of the abovementioned COB display module, an embodiment of the disclosure also provides a manufacturing method for the COB display module. The manufacturing method includes the following steps.

S1, a plurality of LED luminous units 2 are mounted and fixed on a PCB 1.

S2, a packaging adhesive covers the PCB 1 and wraps the plurality of LED luminous units 2 thereon to form a packaging adhesive layer 4, and a liquid passage 41 is formed in the packaging adhesive layer 4 between every two adjacent LED luminous units 2.

S3, a reflecting material covers two sidewalls of the liquid passage 41 to form a reflecting layer 6.

S4, a mask is prepared, the mask being provided with mounting holes matched with the number of the plurality of LED luminous units 2, then the mask is mounted on the PCB 1, and each of the plurality of LED luminous units 2 is provided in each mounting hole to make the mask become a light shielding layer 5 filling the liquid passage 41; or, a light shielding material is injected into the liquid passage 41 to form the light shielding layer 5 filling the liquid passage 41.

In an exemplary embodiment, in S1, the plurality of LED luminous units 2 are arranged according to a matrix, and are fixedly mounted on the PCB 1 respectively, and then a red LED chip 21, a green LED chip 22 and a blue LED chip 23 in each of the plurality of LED luminous units 2 are electrically connected with the PCB 1 by leading bonding respectively.

In S2, the packaging adhesive covers the PCB 1 in a laying manner by use of an injection mold, and wraps the plurality of LED luminous units 2 thereon. The liquid passage 41 may be formed in the packaging adhesive layer 4 between every two adjacent LED luminous units 2 by use of the injection mold, and a depth h of the liquid passage 41 is less than or equal to a thickness H of the packaging adhesive layer 4. In addition, the packaging adhesive layer 4 may also be cut to form the liquid passage 41, and the cutting depth h of the liquid passage 41 is less than a thickness sum of the packaging adhesive layer 4 and the PCB 1.

In S3, the reflecting material is injected into the liquid passage 41 by use of the injection mold to form the reflecting layer 6 covering the two sidewalls of the liquid passage 41 or form the reflecting layer 6 covering the two sidewalls and bottom of the liquid passage 41 according to a specific shape and using method of the injection mold. In addition, the reflecting layer 6 may also be provided with reference to the method of embodiment 2.

In S4, the light shielding material is injected into the liquid passage 41 by use of the injection mold to form light shielding layer 5 completely filling the liquid passage 41 or form the gap between the light shielding layers 5 covering the two sidewalls of the liquid passage 41.

Embodiment 4

Figure 18:
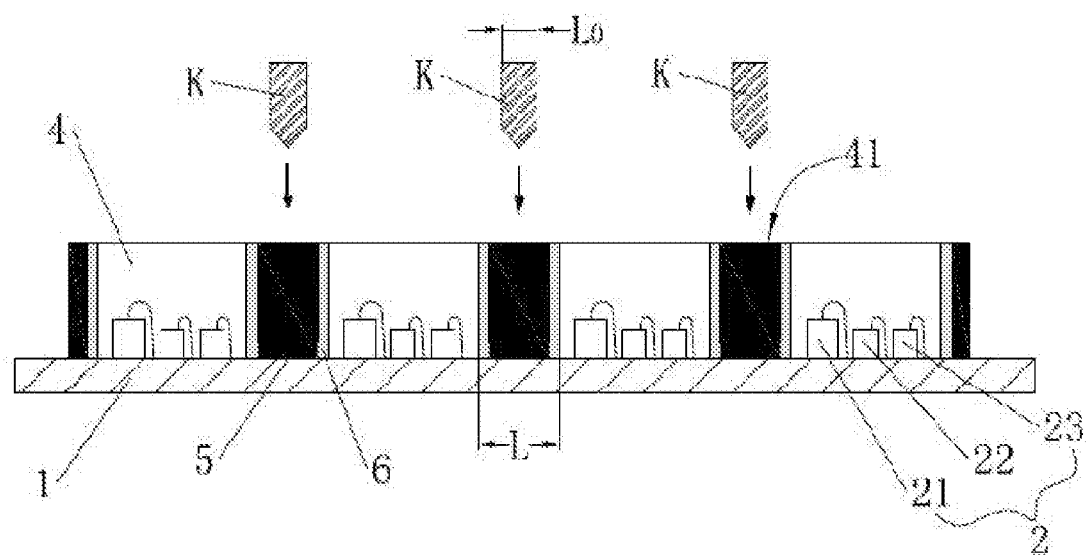
FIG. 18 is a schematic diagram of manufacturing an LED device according to an embodiment of the disclosure.
Figure 19:
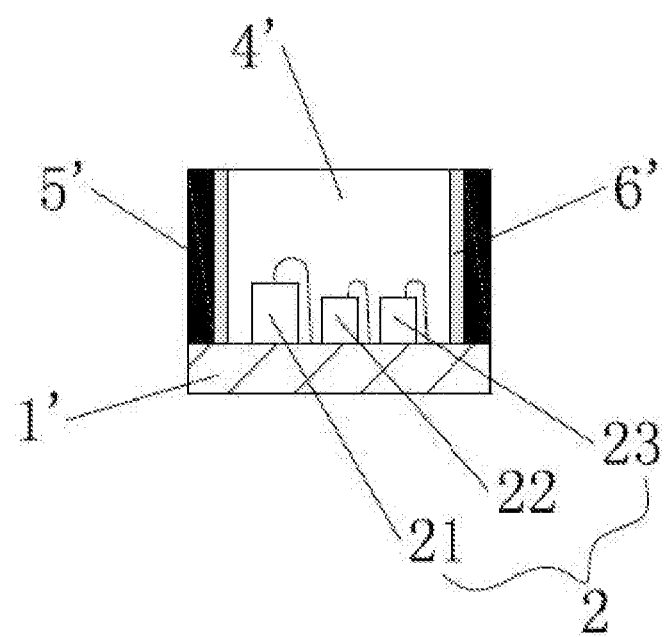
FIG. 19 is a structure diagram of an LED device according to an embodiment of the disclosure.

Referring to FIG. 18 and FIG. 19, FIG. 18 is a schematic diagram of manufacturing an LED device according to an embodiment of the disclosure and FIG. 19 is a structure diagram of an LED device according to an embodiment of the disclosure.

An embodiment of the disclosure provides a manufacturing method for an LED device, which includes the following steps: a COB display module is manufactured at first according to the manufacturing method for the COB display module in embodiments 1-3, and then through cutting is performed by use of a cutter K along a liquid passage 41 of the manufactured COB display module to obtain a single LED device, a width $L_0$ of the cutter K is less than a width L of the liquid passage 41 and a cutting position thereof is in the middle of the liquid passage 41.

When the COB display module is used for manufacturing the LED device, no driver IC, resistor and capacitor are required to be mounted on a back surface of a PCB 1 thereof.

The manufactured LED device is a chip LED device, and includes a substrate 1', LED luminous units 2, a packaging adhesive layer 4', a light shielding layer 5' and a reflecting layer 6'. The LED luminous units 2 are provided on the substrate 1', the packaging adhesive layer 4' wraps the LED luminous units 2, the light shielding layer 5' is provided on a sidewall of the packaging adhesive layer 4', and the reflecting layer 6' covers the sidewall of the packaging adhesive layer 4', and the reflecting layer 6' is positioned between the packaging adhesive layer 4' and the light shielding layer 5'.

The substrate 1' is obtained by cutting the PCB 1 in the COB display module. Each LED luminous unit 2 is an LED luminous unit 2 in the COB display module which is not cut, and includes a red LED chip 21, a green LED chip 22 and a blue LED chip 23. The packaging adhesive layer 4' corresponds to a packaging adhesive layer 4 in the COB display module which is not cut. The light shielding layer 5' corresponds to a light shielding layer 5 in the COB display module which is not cut. The reflecting layer 6' corresponds to a reflecting layer 6 in the COB display module which is not cut.

Not only is the light shielding layer provided in the LED device provided in an embodiment of the disclosure, but also the reflecting layer is provided, so that the advantages of display high contrast, high resolution and low light loss are achieved.

The disclosure is not limited to the abovementioned implementation modes. If various modifications or transformations are made to the disclosure without departing from the spirit and scope of the disclosure and these modifications and transformations fall within the scopes of the claims of the disclosure and equivalent arts, the disclosure is also intended to include these modifications and transformations.

What is claimed is:

1. A Chip-on-Board (COB) display module, comprising a Printed Circuit Board (PCB), a plurality of Light-Emitting Diode (LED) luminous units, a packaging adhesive layer and a light shielding layer, wherein the plurality of LED luminous units are mounted and fixed on the PCB, the packaging adhesive layer covers the PCB and wraps the LED luminous units thereon, a liquid passage is provided in the packaging adhesive layer between every two adjacent LED luminous units, and the light shielding layer fills the liquid passage; wherein the COB display module further comprises a reflecting layer, and the reflecting layer covers two sidewalls of the liquid passage, and is positioned between the packaging adhesive layer and the light shielding layer.

2. The COB display module as claimed in claim 1, wherein the light shielding layer covers the two sidewalls and a bottom of the liquid passage, a gap is formed between the light shielding layer covering the two sidewalls of the liquid passage, or the light shielding layer completely fills the liquid passage.

3. The COB display module as claimed in claim 2, wherein a thickness of the reflecting layer covering each sidewall of the liquid passage is less than 0.1 mm.

4. The COB display module as claimed in claim 2, wherein the reflecting layer covers the bottom of the liquid passage.

5. The COB display module as claimed in claim 2, wherein the reflecting layer is at least one of an aluminum or tin or silver doped epoxy resin, an aluminum or tin or silver doped silicon resin, an aluminum or tin or silver doped acrylic resin and an aluminum or tin or silver doped polycarbonate.

6. The COB display module as claimed in claim 2, wherein a depth of the liquid passage is less than a thickness of the packaging adhesive layer.

7. The COB display module as claimed in claim 2, wherein a thickness of the packaging adhesive layer is 0.5 mm-1.6 min, and a depth of the liquid passage is 0.3 mm-1.5 mm.

8. The COB display module as claimed in claim 1, wherein the light shielding layer fills a part of the liquid passage, and a surface of the light shielding layer is lower than an illuminant surface of the packaging adhesive layer.

9. The COB display module as claimed in claim 1, wherein the light shielding layer is black PPA plastics or black PCT plastics or black EMC plastics.

10. The COB display module as claimed in claim 1, wherein a depth of the liquid passage is less than a thickness sum of the packaging adhesive layer and the PCB.

11. The COB display module as claimed in claim 1, wherein a thickness of the packaging adhesive layer is 0.15-1.6 mm, and, a depth of the liquid passage is 0.08 mm-1.5 mm.

12. The COB display module as claimed in claim 1, wherein the PCB is a single-layer circuit board or a multi-layer circuit board.

13. The COB display module as claimed in claim 1, wherein the plurality of LED luminous units are provided in a linear array or a triangular array, each of the plurality of LED luminous units comprises a red LED chip, a green LED chip and a blue LED chip, and each of the red LED chip, the green LED chip and the blue LED chip is any one of a horizontal chip or a flip chip.

14. The COB display module as claimed in claim 1, wherein the COB display module further comprises at least one driver Integrated Chip (IC), at least one resistor and at least one capacitor, the driver IC, the resistor and the capacitor are mounted on a back surface of the PCB.

15. A manufacturing method for a Chip-on-Board (COB) display module, comprising the following steps:
S1: mounting and fixing a plurality of Light-Emitting Diode (LED) luminous units on a Printed Circuit Board (PCB);
S2: by a packaging adhesive, covering the PCB and wrapping the plurality of LED luminous units thereon to form a packaging adhesive layer, and forming a liquid passage in the packaging adhesive layer between every two adjacent LED luminous units;
S3: covering, by a reflecting material, two sidewalls of the liquid passage to form a reflecting layer; and
S4: preparing a mask, the mask being provided with a plurality of mounting holes matched with a number of the plurality of LED luminous units, then mounting the mask on the PCB, and arranging each of the plurality of LED luminous units in each of the plurality of mounting holes to make the mask become a light shielding layer filling the liquid passage; or, injecting a light shielding material into the liquid passage to form the light shielding layer filling the liquid passage.

16. The manufacturing method for the COB display module as claimed in claim 15, wherein S4 is implemented by: injecting the light shielding material into the liquid passage to form the light shielding layer covering the two sidewalls and a bottom of the liquid passage, the reflecting layer being positioned between the packaging adhesive layer and the light shielding layer.

17. The manufacturing method for the COB display module as claimed in claim 16, wherein, in S3, the reflecting material is injected into the liquid passage by use of an injection mold to form the reflecting layer covering the two sidewalls of the liquid passage or form the reflecting layer covering the two sidewalls and the bottom of the liquid passage.

18. The manufacturing method for the COB display module as claimed in claim 16, wherein, in S3, a protective film covers illuminant surfaces of the packaging adhesive layer, then the two sidewalls of the liquid passage or the two sidewalls and the bottom of the liquid passage are spray-coated with the reflecting material, and the protective film is removed after spray-coating.

19. The manufacturing method for the COB display module as claimed in claim 18, wherein, in S1, the plurality of LED luminous units are arranged according to a matrix and are fixedly mounted on the PCB respectively; and in S3, there are a plurality of protective films, the plurality of protective films transversely cover the illuminant surfaces of the packaging adhesive layer on the LED luminous units of each row respectively, then the liquid passage between the LED luminous units of every two adjacent rows is spray-coated with the reflecting material, the protective films are removed, the plurality of protective films longitudinally cover the illuminant surfaces of the packaging adhesive layer on the LED luminous units of each column respectively, then the liquid passage between the LED luminous units of every two adjacent columns is spray-coated with the reflecting material, and the plurality of protective films are finally removed.

20. The manufacturing method for the COB display module as claimed in claim 16, wherein, in S4, the light shielding material is injected into the liquid passage by use of an injection mold to completely fill the liquid passage with the formed light shielding layer or form a gap between light shielding layers covering the two sidewalls of the liquid passage.

21. The manufacturing method for the COB display module as claimed in claim 15, wherein, in S2, the packaging adhesive layer is cut to form the liquid passage, and a cutting depth of the liquid passage is less than a thickness sum of the packaging adhesive layer and the PCB; or, the packaging adhesive covers the PCB by use of an injection mold to form the packaging adhesive layer with the liquid passage, a depth of the liquid passage being less than or equal to a thickness of the packaging adhesive layer.

22. A manufacturing method for a Light-Emitting Diode (LED) device, comprising the following steps: manufacturing a Chip-on-Board (COB) display module at first according to the manufacturing method for the COB display module as claimed in claim 15, and then performing through cutting by use of a cutter along a liquid passage of the manufactured COB display module to obtain a single LED device, a width of the cutter being less than a width of the liquid passage and a cutting position thereof being provided in a middle of the liquid passage.

23. A Light-Emitting Diode (LED) device, wherein the LED device is manufactured by the manufacturing method for the LED device as claimed in claim 22.

* * * * *